United States Patent
Gatterbauer et al.

(10) Patent No.: US 8,822,327 B2
(45) Date of Patent: Sep. 2, 2014

(54) CONTACT PADS WITH SIDEWALL SPACERS AND METHOD OF MAKING CONTACT PADS WITH SIDEWALL SPACERS

(75) Inventors: Johann Gatterbauer, Parsberg (DE); Bernhard Weidgans, Bernhardswald (DE)

(73) Assignee: Infineon Technologies AG, Neubiberg (DE)

( * ) Notice: Subject to any disclaimer, the term of this patent is extended or adjusted under 35 U.S.C. 154(b) by 87 days.

(21) Appl. No.: 13/587,809

(22) Filed: Aug. 16, 2012

(65) Prior Publication Data
US 2014/0048941 A1    Feb. 20, 2014

(51) Int. Cl.
*H01L 21/4763*    (2006.01)

(52) U.S. Cl.
USPC ........... 438/618; 257/762; 257/766; 257/775; 257/782

(58) Field of Classification Search
CPC .................. H01L 29/01029; H01L 29/01079; H01L 23/53238
USPC .................................. 257/762, 766, 775, 781
See application file for complete search history.

(56) References Cited

U.S. PATENT DOCUMENTS

| | | | | |
|---|---|---|---|---|
| 4,735,913 | A | * | 4/1988 | Hayes ........................... 438/181 |
| 5,550,065 | A | * | 8/1996 | Hashemi et al. .............. 438/182 |
| 2006/0076677 | A1 | | 4/2006 | Daubenspeck et al. |
| 2008/0050905 | A1 | | 2/2008 | Uchida et al. |
| 2011/0140190 | A1 | * | 6/2011 | Fumitake ....................... 257/324 |
| 2011/0233766 | A1 | | 9/2011 | Lin et al. |

* cited by examiner

*Primary Examiner* — Thao X Le
*Assistant Examiner* — Geoffrey Ida
(74) *Attorney, Agent, or Firm* — Slater & Matsil, L.L.P.

(57) ABSTRACT

A chip contact pad and a method of making a chip contact pad are disclosed. An embodiment of the present invention includes forming a plurality of contact pads over a workpiece, each contact pad having lower sidewalls and upper sidewalls and reducing a lower width of each contact pad so that an upper width of each contact pad is larger than the lower width. The method further includes forming a photoresist over the plurality of contact pads and removing portions of the photoresist thereby forming sidewall spacers along the lower sidewalls.

10 Claims, 5 Drawing Sheets

CONTACT PADS WITH SIDEWALL SPACERS AND METHOD OF MAKING CONTACT PADS WITH SIDEWALL SPACERS

TECHNICAL FIELD

The present invention relates generally to a semiconductor device and a method of making a semiconductor device. In particular, embodiments of the invention relate to chip contact pads having sidewall spacers and a method of making chip contact pads having sidewall spacers.

BACKGROUND

Power semiconductor devices are semiconductor devices used as switches or rectifiers in power electronic circuits.

The realm of power devices is divided into two main categories: The two-terminal devices (diodes), whose state is completely dependent on the external power circuit they are connected to; and the three-terminal devices, whose state is not only dependent on their external power circuit, but also on the signal on their driving terminal (gate or base). Transistors and thyristors belong to that category.

A second classification is less obvious, but has a strong influence on device performance: Some devices are majority carrier devices such as Schottky diode and MOSFET, while the others are minority carrier devices such as Thyristor, bipolar transistor, and IGBT. The former use only one type of charge carriers, while the latter use both (i.e. electrons and holes). The majority carrier devices are faster, but the charge injection of minority carrier devices allows for better On-state performance.

SUMMARY OF THE INVENTION

In accordance with an embodiment of the present invention, a method of making a semiconductor device comprises forming a plurality of contact pads over a workpiece, each contact pad having lower sidewalls and upper sidewalls and reducing a lower width of each contact pad so that an upper width of each contact pad is larger than the lower width. The method further comprises forming a photoresist over the plurality of contact pads and removing portions of the photoresist thereby forming sidewall spacers along the lower sidewalls.

In accordance with an embodiment of the present invention, a method of making a semiconductor device comprises forming a plurality of chip contact pads over a workpiece, wherein each chip contact pad has an upper portion and a lower portion, the upper portion laterally protruding the lower portion, and wherein each chip contact pad comprises upper sidewalls along the upper portion and lower sidewalls along the lower portion. The method further comprises forming photoresist spacers on the lower sidewalls of the plurality of chip contact pads, forming a plurality of chips by cutting the workpiece, each chip having a bond contact pad and placing a chip of the plurality of chips on a carrier. The method finally comprises bonding the chip contact pad to the carrier contact pad of the carrier and encapsulating the chip with an encapsulation material.

In accordance with an embodiment of the present invention, a semiconductor device comprises a carrier, a chip disposed on the carrier and a first chip contact pad arranged on the chip, the first chip contact pad having lower sidewalls and upper sidewalls, a lower width of the first chip contact pad being smaller than an upper width of the first chip contact pad, the lower width corresponding to the lower sidewalls and the upper width corresponding to the upper sidewalls. The semiconductor device further comprises photoresist sidewall spacers disposed along the lower sidewalls of the first chip contact pad and an encapsulation material encapsulating the chip.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely photoresist sidewall spacers of power contact elements. The invention may also be applied, however, to other type of sidewall spacers of other contact elements.

Figure 1:
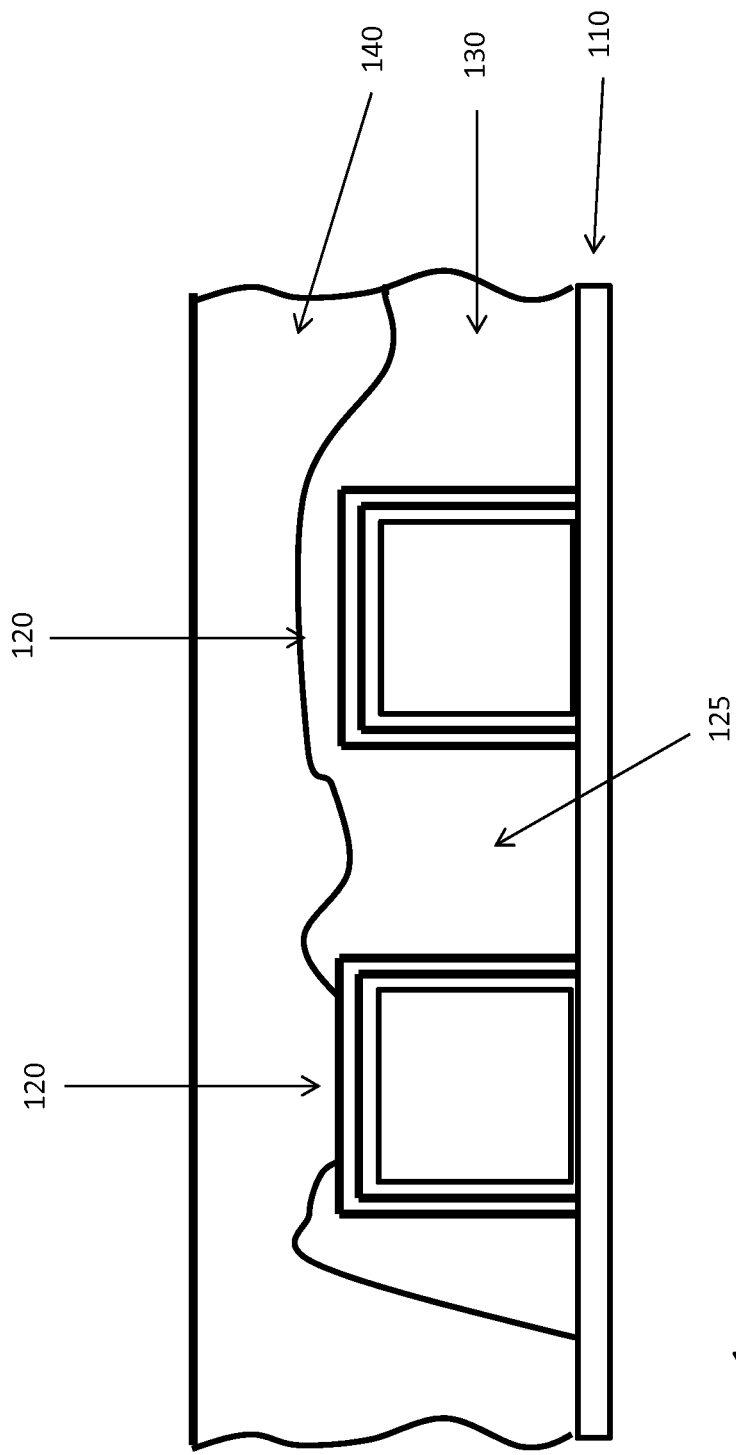
FIG. 1 illustrates conventional chip contact pads.

FIG. 1 illustrates conventional power contact pads 120. The conventional power contact pads 120 are encapsulated in a mold compound 140. A problem with the conventional power contact pads 120 is that the mold compound does not properly adhere to the passivation layer 110 and to palladium oxide on the top surface and the sidewalls of the power contact pads. A further problem with the conventional power contact pads 120 is that the coarse particles of the mold compound do not properly fill the space 125 between closely spaced adjacent power contact pads 120. Finally, a problem with the conventional power contact pads 120 is that the amount of polyimide 130 used around the conventional power contact pads 120 creates a substantial wafer bow.

Therefore, a packed power semiconductor device is needed in the art in which sidewall spacers provide proper adhesion to the passivation layer and the sidewalls of a chip contact pad and further provides proper dielectric strength (electrical potential required to break down the insulator per unit thickness) between adjacent chip contact pads.

An embodiment of the invention provides a chip contact pad having an undercut and therefore lower smaller width and an upper larger width. An embodiment of the invention provides sidewall spacers along sidewalls of the lower smaller width but not along sidewalls of the upper larger width. A further embodiment of the invention provides sidewall spacers on opposite sidewalls of closely spaced chip contact pads, wherein the majority of the space between the chip contact pads is filled with an encapsulation material.

An embodiment of the invention provides a method of forming photoresist sidewall spacers on chip contact pads by depositing a positive photoresist over chip contact pads and exposing the positive photoresist without using a lithography mask.

An advantage is that sidewall spacers of chip contact pads can be formed by exposing a positive photoresist without a lithography mask or exposing the positive photoresist with a dummy lithography mask. A further advantage is that dielectric strength is increased and that the wafer bow is reduced because less photoresist is used. A final advantage is that the sidewall spacer are well defined without using a lithography mask.

Figure 2A:
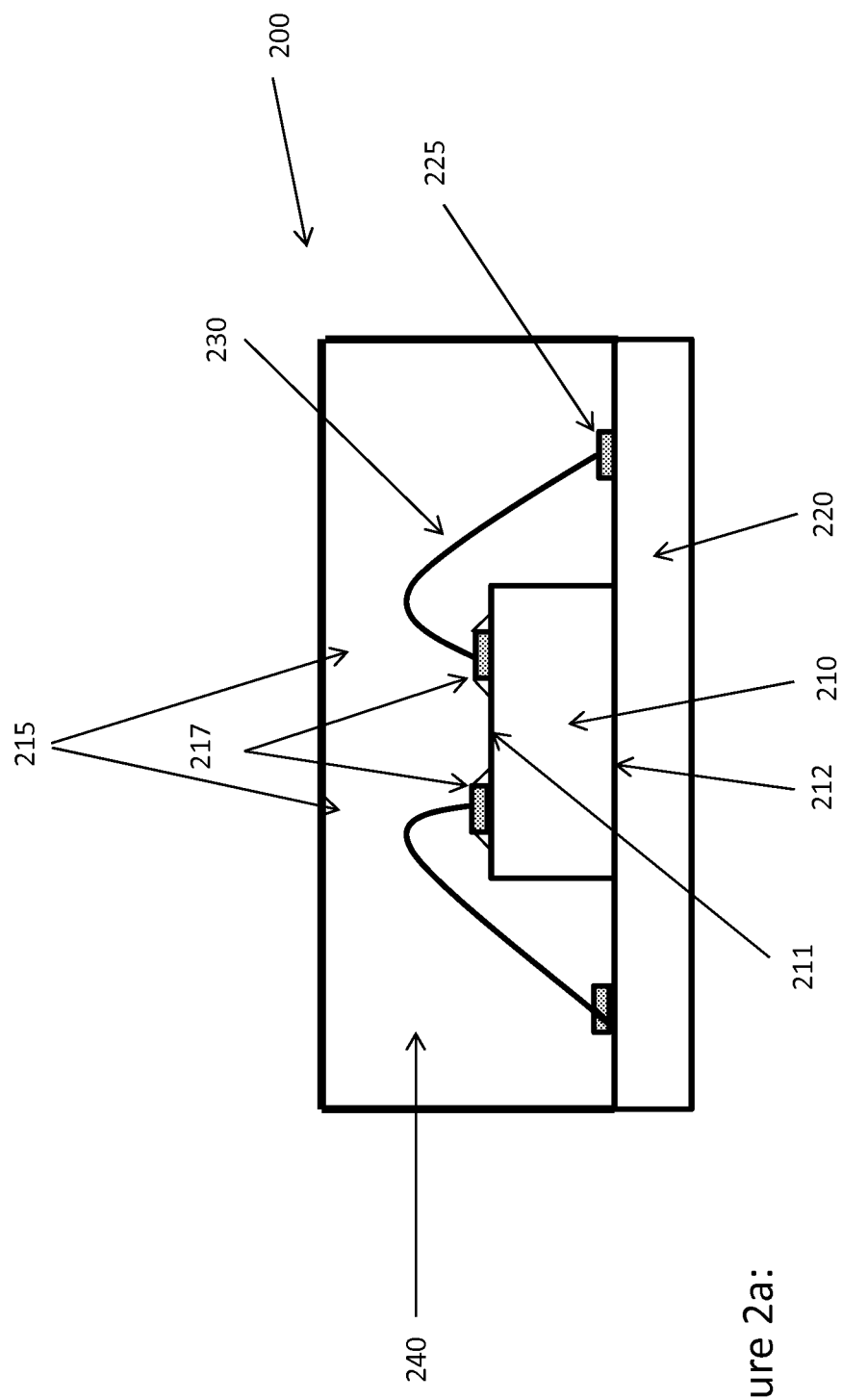
FIG. 2a illustrates an embodiment of a packaged semiconductor device having sidewall spacers on chip contact pads.

FIG. 2a shows an embodiment of a packaged power semiconductor device 200. A chip 210 is disposed on a carrier 220. The chip 210 has a first main surface 211 and a second main surface 212. Chip contact pads 215 are disposed on the first main surface 211. Sidewall spacers 217 are disposed on sidewalls of the chip contact pads 215. The chip contact pads 215 are electrically connected to carrier contact pads 225 via bondwires 230. The chip 210 is encapsulated with an encapsulation material 240 such as a molding compound.

The chip 210 comprises a semiconductor substrate. The semiconductor substrate may be a single crystal substrate such as silicon or germanium, or a compound substrate such as SiGe, GaAs, InP or SiC. One or more interconnect metallization layers may be arranged on the substrate. A passivation layer is disposed on the top surface of the metallization layers in order to seal the chip. The top surface of the chip is the first main surface 211. The bottom of the substrate is the second main surface 212 of the chip. Chip contact pads 215 are disposed on the top surface 211 of the chip 210.

The chip 210 may comprise an integrated circuit (IC) or a discrete device such as a single transistor. For example, the chip 210 may comprise a power semiconductor device such as a bipolar transistor, an insulated gate bipolar transistor (IGBT), a power MOSFET, a thyristor or a diode.

The carrier 220 may comprise a substrate, a lead frame or a printed circuit board (PCB). The carrier 220 may comprise carrier contact pads 225. The carrier contact pads 225 comprise a conductive material such as a metal. For example, the carrier contact pads 225 comprise copper and nickel.

The chip 210 is attached to the carrier 220 by gluing or soldering. For example, the second main surface 212 of the chip 210 is bonded or glued to the top surface of the carrier 220 with an adhesive tape. Alternatively, the second main surface 212 of the chip 210 is bonded or glued to the top surface of the carrier 220 using an electrically insulating adhesive such as a resin.

The chip contact pads 215 are electrically connected to the carrier contact pads 225 via bondwires 230. The bondwires 230 may comprise copper (Cu), gold (Au) or aluminum (Al). The bondwires 230 may be connected to the chip contact pads 215 and/or carrier contact pads 225 via a ball bonding process or a wedge bonding process. Embodiments of the chip contact pads 215 are discussed with respect to FIG. 3 below.

An encapsulation material 240 encapsulates the chip 210 and overlies the top surface of the carrier 220. The encapsulation material 240 may be a molding compound. The molding compound 240 may comprise a thermoset material or a thermoplastic material. The molding compound may comprise coarse grained material particles.

In one embodiment, the chip 210 may be attached to a heat sink. The heat sink may be arranged between the chip 210 and the carrier 220. In one embodiment the carrier 220 may comprise the heat sink. Packaging and heat sinks provide a means for removing heat from the semiconductor device by conducting it to the external environment. Generally, large current devices have large die and packaging surface areas and lower thermal resistance.

Figure 2B:
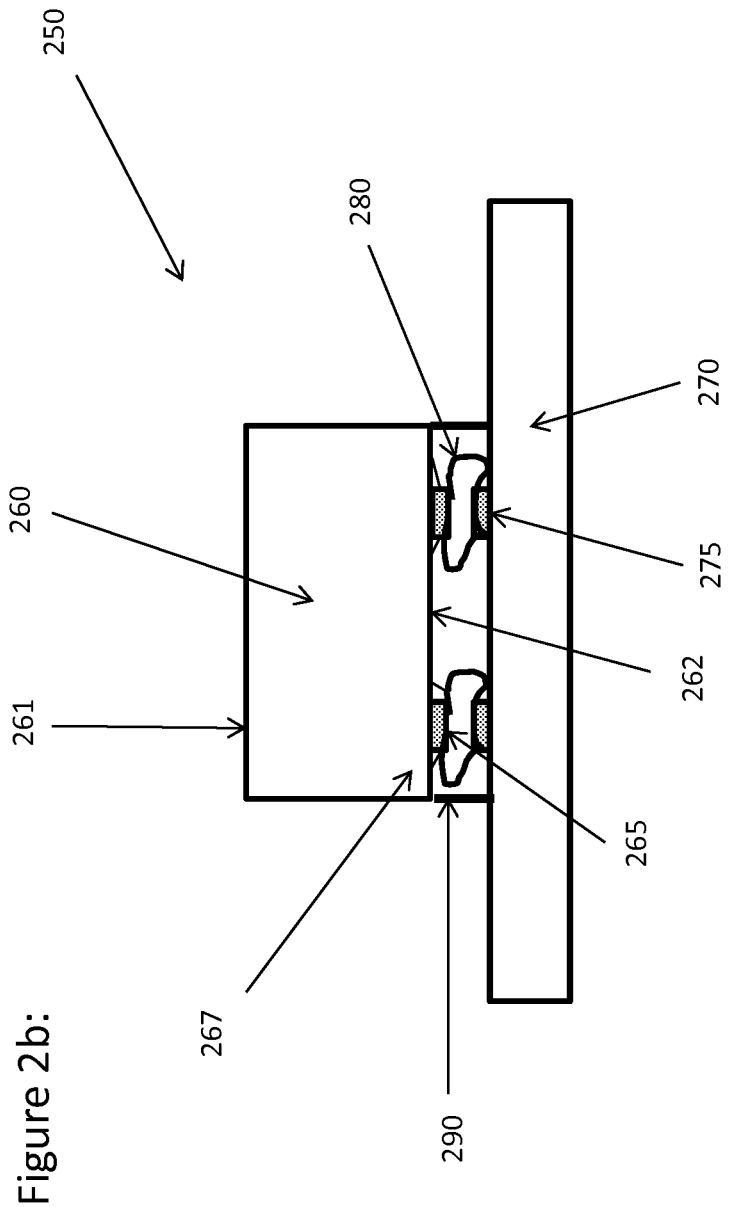
FIG. 2b illustrates a further embodiment of a packaged semiconductor device having sidewall spacers on chip contact pads.

FIG. 2b shows another embodiment of a packaged power semiconductor device 250. A chip 260 is disposed on a carrier 270. The chip 260 has a first main surface 261 and a second main surface 262. Chip contact pads 265 are arranged on the second main surface 262. Sidewall spacers 267 are disposed on sidewalls of the chip contact pads 265. The chip contact pads 265 are electrically connected to carrier contact pads 275 via solder balls 280. The chip 260 is encapsulated with an encapsulation material 290 such as a molding compound.

The embodiment of FIG. 2b may comprise similar or the same materials and elements as described with respect to FIG. 2a except for the electrical connection between the chip 260 and the carrier 270. For example, the chip 260 may be integrated circuit (IC) or a discrete device. In the embodiment of FIG. 2b the chip 260 is electrically connected to the carrier 270 using solder bumps. Alternatively, gold bumps, molded studs or electrically conductive polymers can be used. The chip 260 is placed on the carrier 270 in a flip chip arrangement so that the first main surface 261 faces the top surface of the carrier 270 and the second main surface 262 faces away from the carrier top surface. The solder bumps may be lead based or lead less solder bumps.

Figure 3:
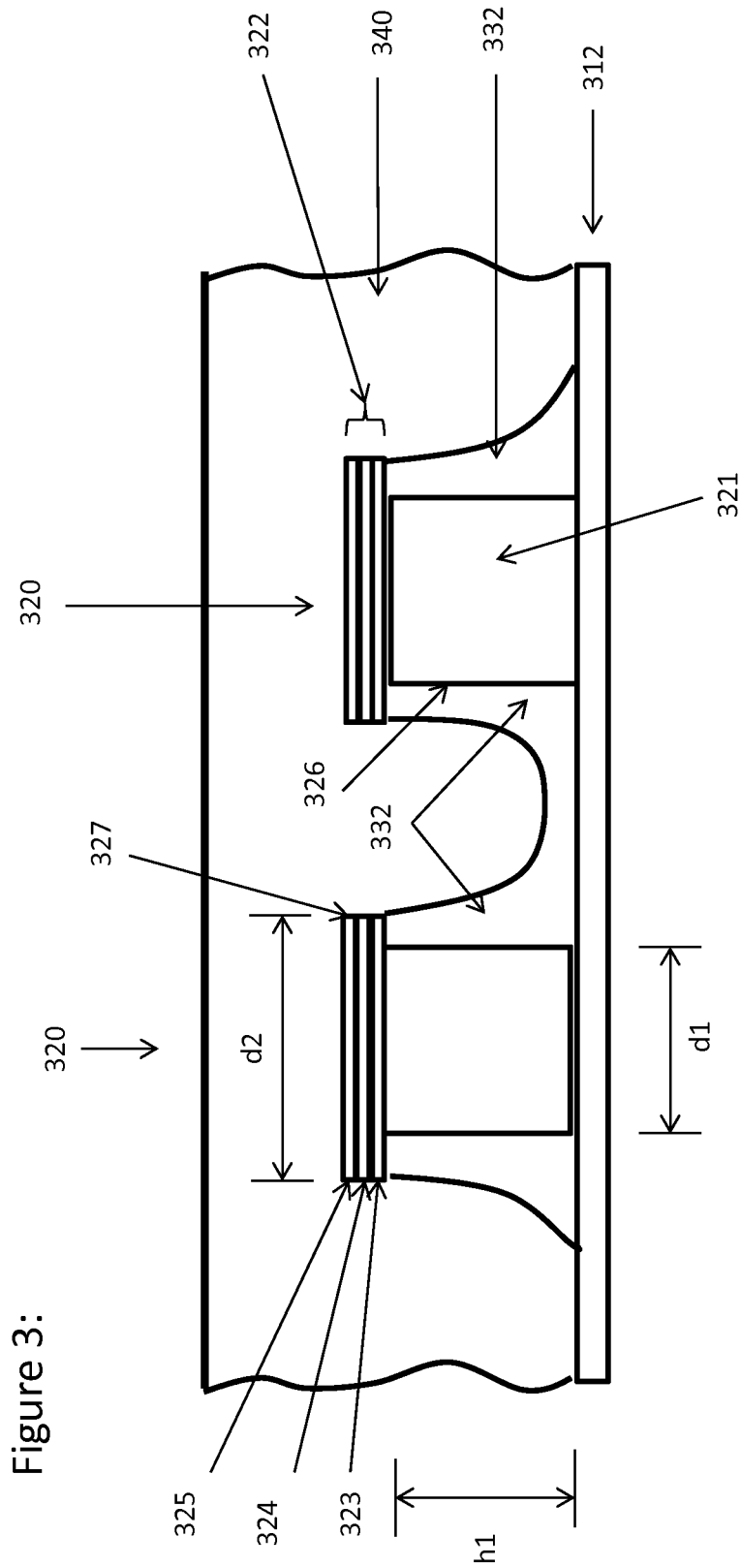
FIG. 3 illustrates an embodiment of a detailed view of a portion of the top surface of a chip.

FIG. 3 illustrates an embodiment of a detailed view of a portion of the top surface 211 of the chip 210 of the embodiments of FIGS. 2a and 2b. Chip contact pads 320 are disposed on a passivation layer 312. The passivation layer 312 may comprise SiN for example. The chip contact pads 320 may be electrically connected to a top metal of the metallization layer stack thorough a contact via.

The chip contact pads 320 may be made from a conductive material such as a metal. For example, the chip contact pads 320 may comprise a copper (Cu) layer 321. Alternatively, the chip contact pads 320 may comprise copper alloy layer 321 including a predetermined proportion of Cr, Al, Si, Ti, Fe, Ag, Pd and/or combinations thereof. The chip contact pads 320 further comprises a metallic material layer stack 322. The metallic material layer stack 322 may comprise at least one metallic material. For example, a first layer of the metallic material layer stack 322 may be a Ni or a Ni alloy layer 323. A second layer of the metallic material layer stack may be an optional palladium (Pd) or palladium alloy layer 324. An third layer of the metallic material layer stack 322 may be an optional gold (Au) layer or gold alloy layer 325. The metallic material layer stack 322 may comprise more than three metal layers.

The copper layer 321 may comprise first sidewalls or lower sidewalls 326 and the metallic material layer stack 322 may comprise second sidewalls or upper sidewalls 327. The height h of the first sidewalls 326 may be about 1 μm to about 50 μm. Alternatively, the height h of the first sidewalls 326 may be about 6 μm to about 20 μm. The height of the second sidewalls 327 may be about 1 μm to about 10 μm. The chip contact pad may comprise a mushroom topology. The copper layer 321 has a first width $d_1$ and the metallic material layer stack 322 has a second width $d_2$. The first width $d_1$ is different than the second width $d_2$. In particular, the second width $d_2$ is larger than the first width $d_1$. The metallic material layer stack 322 of the chip contact pads 320 may laterally protrude or overhang the copper layer 321 of the chip contact pads 320. For example, the width $d_1$ of the copper layer 321 is about 20 μm to about 500 μm. The overhang overhangs the copper layer 321 by about 0.5 μm to about 1 μm on each side of the chip contact pads 320.

Sidewall spacers 332 are disposed along the first sidewalls 326 and may not be disposed along the second sidewalls 327. The sidewall spacers 332 may comprise an insulator material. The insulator material may comprise a higher dielectric strength than the encapsulation material. The insulator material may be a positive photoresist, e.g., a PBO (Poly-Benz-Oxazole) or a polyimide. The sidewall spacers 332 are located predominantly under the overhang where the light of the exposure did not expose or only limited expose the positive photoresist.

An encapsulation material 340 surrounds the contact chip contact pads 320 and the sidewall spacers 332. The encapsulation material 340 may be a molding compound. The molding compound 340 may fill the majority of the space between the closely spaced contact chip pads 320. The molding compound 340 may fill a center portion of the space between the closely spaced contact chip pads.

Figure 4:
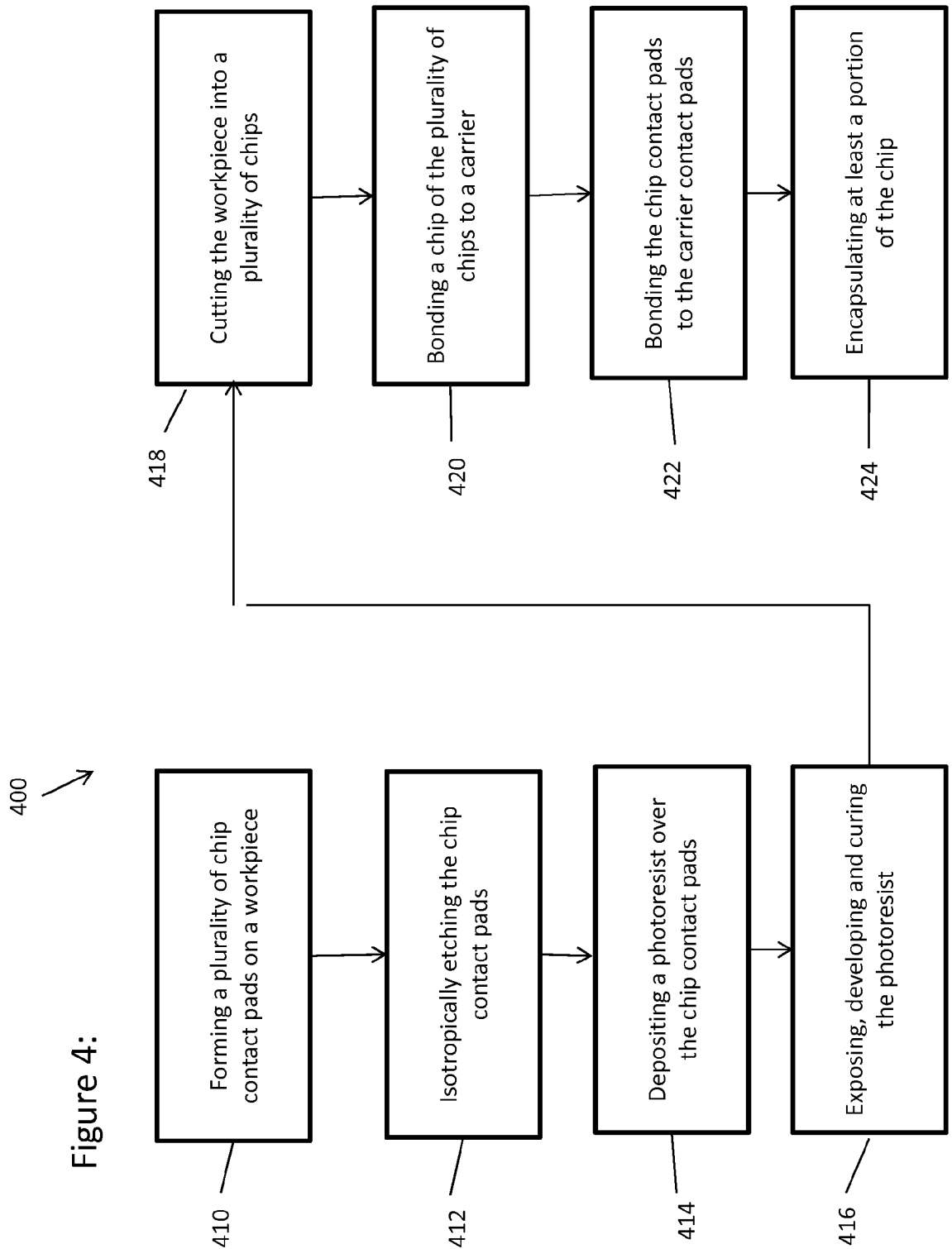
FIG. 4 illustrates a flowchart of an embodiment of a method of manufacturing a semiconductor device having chip contact pads with sidewall spacers.

FIG. 4 shows a flowchart 400 of an embodiment of a method of manufacturing a semiconductor device having chip contact pads with sidewall spacers. In a first step 410 a plurality of chip contact pads are formed on a workpiece. The workpiece may be a substrate, a wafer or a printed circuit board (PCB). In one embodiment the substrate may comprise a semiconductor material or a compound material and one or more interconnect metallization layers disposed thereon. A passivation layer is disposed over the interconnect metallization layers and the chip contact pads are disposed on the passivation layer. The chip contact pads are connected through a contact via to the most upper metal layer of the interconnect metallization layers. In another embodiment the substrate may comprise conducting layers made of thin metal foil embedded in insulating layers laminated together with epoxy resin prepreg for example.

In an embodiment a copper layer or a copper alloy layer is masked on the passivation layer. For example, the copper or copper alloy layer is formed by first forming a seed layer and then depositing copper/copper alloy in an electro chemical plating process or electro galvanic plating. The chip contact pads may further include a metallic material layer stack. The metallic material layer stack may also be formed by electrochemical plating or electro galvanic plating. The metallic material layer stack may comprise a nickel (Ni) layer or a nickel alloy layer. The metallic layer stack may further comprise an optional palladium (Pd) or a palladium alloy layer. Finally, the metallic layer stack may comprise an optional gold or gold alloy layer. Alternatively, the chip contact pads may be formed by other deposition processes such as be electro-less plating or PVD processes.

Next, at 412, the copper layer may be etched after the chip contact pads are formed. The etch is an isotropic chemical wet etch. The wet chemical etch is selective to the passivation layer and the metallic material layer stack. The wet chemical etch reduces the width of the copper layer relative to the width of the metallic material layer stack. The metallic material layer stack laterally protrudes or overhangs the copper layer. The overhang of the metallic material layer stack overhangs the copper or copper alloy layer by about 0.5 µm to about 1 µm on each side.

A photoresist may be disposed over the contact pads (step 414). The photoresist may be disposed or spun over the chip contact pads. The photoresist may be a positive photoresist. A positive photoresist is a type of photoresist in which the portion of the photoresist that is exposed to light becomes soluble.

The photoresist may be exposed, developed and cured (step 416). The photoresist may be exposed to light without using a photo lithography mask. Alternatively, the photoresist may be exposed with a dummy photo lithography mask without any structures thereon. The light exposes the photoresist except under the overhang. The photoresist under the overhang is in a shadow zone when the photoresist is exposed. The light may not sufficiently expose the photoresist near the chip contact pads. In one embodiment when two chip contact pads are closely spaced from each other, the light may not sufficiently expose the photoresist between the two adjacent chip contact pads so that the photoresist in these locations does not become soluble. In one embodiment the photoresist may only remain in an area below the top surface of the chip contact pads.

In a further embodiment the positive photoresist is exposed with defocused light. The focus of the exposure light may be set at the level of the top surface of the chip contact pads. The light may not sufficiently expose the photoresist near the bottom of the chip contact pads so that the photoresist is not removed in a later process step. The positive photoresist is then developed and cured. The undercut generated during the copper layer etching establishes a good protection of these sidewalls. In one embodiment, the sidewall spacers are not disposed on the sidewalls of the metallic material layer stack.

In the next step 418 the workpiece is singulated or cut into a plurality of chips or dies. Each chip comprises at least one chip contact pad including the photoresist sidewall spacers. For example, a diode may comprise a single chip contact pad and other devices may comprise two or more chip contact pads.

In the next step 420 a chip of the plurality of chips is placed on a carrier such as a lead frame or a printed circuit board (PCB). The chips may be attached to the carrier by gluing or soldering. For example, the chip may be attached to the carrier applying an adhesive tape. In one embodiment the chip is bonded to the carrier with the chip contact pads facing away from the carrier. In another embodiment the chip is bonded to the carrier with the chip contact pads facing toward the carrier.

Then, the chip contact pads may be bonded to the carrier contact pads of the carrier (step 422). For example, the chip contact pads of the chip are wire bonded to the carrier contact pads of the carrier. Alternatively, the chip contact pads of the chip are soldered to carrier contact pads of the carrier. In one embodiment, the chip contact pads of the chip which are wirebonded to the carrier contact pads using aluminum wires comprise a palladium layer in the metallic material layer stack while the chip contact pads which are wirebonded to the carrier contact pads using copper wires do not comprise a palladium layer in the metallic material layer stack.

Finally, at step 424, the chip is encapsulated with an encapsulation material. The encapsulation material may be a molding compound. The molding compound may comprise a thermoset material or a thermoplastic material. The molding compound may comprise a coarse grained material.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of making a semiconductor device, the method comprising:
    forming a plurality of contact pads over a workpiece, each contact pad having lower sidewalls and upper sidewalls;
    reducing a lower width of each contact pad so that an upper width of each contact pad is larger than the lower width;
    forming a photoresist over the plurality of contact pads; and
    removing portions of the photoresist thereby forming sidewall spacers along the lower sidewalls wherein forming the plurality of contact pads comprises forming a copper layer or copper alloy layer lower portion and then forming a metallic material layer stack upper portion, wherein the metallic material layer stack comprises nickel (Ni), and wherein forming the photoresist comprises forming a positive photoresist.

2. The method according to claim 1, wherein removing the positive photoresist comprises exposing the positive photoresist and developing the positive photoresist.

3. The method according to claim 2, wherein exposing the positive photoresist comprises exposing the positive photoresist without using a lithography mask.

4. The method according to claim 2, wherein exposing the positive photoresist comprises exposing the positive photoresist with a dummy lithography mask.

5. The method according to claim 1, wherein the photoresist is a polyimide or a PBO (Poly-Benz-Oxazole).

6. The method according to claim 1, wherein forming the copper layer comprises electrochemical plating the copper, and wherein forming the metallic material layer stack comprises electrochemical plating nickel (Ni), then electrochemical plating palladium (Pd).

7. A method of making a semiconductor device:
    forming a plurality of chip contact pads over a workpiece, wherein each chip contact pad has an upper portion and a lower portion; the upper portion laterally protruding the lower portion reducing a lower width of each contact pad so that an upper width of each contact pad is larger than the lower width, wherein each chip contact pad comprises upper sidewalls along the upper portion and lower sidewalls along the lower portion, wherein the lower portion of the chip contact pads comprises copper or a copper alloy, wherein the upper portion of the chip contact pad comprises a metallic layer stack, and wherein the metallic layer stack comprises a nickel layer (Ni);
    forming photoresist spacers on the lower sidewalls of the plurality of chip contact pads; wherein forming the photoresist spacer comprises forming a positive photoresist over the workpiece; removing portions of the positive photoresist from the workpiece thereby forming positive photoresist spacers;
    forming a plurality of chips by cutting the workpiece, each chip having a chip contact pad;
    placing a chip of the plurality of chips on a carrier;
    bonding the chip contact pad a carrier contact pad of the carrier; and
    encapsulating the chip with an encapsulation material.

8. The method according to claim 7, wherein removing the positive photoresist comprises exposing the positive photoresist to light, developing the positive photoresist, and curing the positive photoresist.

9. The method according to claim 8, wherein exposing the positive photoresist to light comprises exposing the positive photoresist without using a lithography mask or exposing the positive photoresist with a dummy lithography mask.

10. The method according to claim 7, wherein the metallic layer stack further comprises a palladium layer (Pd).

* * * * *

UNITED STATES PATENT AND TRADEMARK OFFICE
CERTIFICATE OF CORRECTION

PATENT NO. : 8,822,327 B2  
APPLICATION NO. : 13/587809  
DATED : September 2, 2014  
INVENTOR(S) : Johann Gatterbauer Page 1 of 1

It is certified that error appears in the above-identified patent and that said Letters Patent is hereby corrected as shown below:

In the Claims

Col. 8, lines 4-5, claim 7, after "lower portion" delete "the upper portion laterally protruding the lower portion".

Col. 8, line 7, claim 7, after "lower width" insert --the upper portion laterally protruding the lower portion,--.

Signed and Sealed this
Seventeenth Day of February, 2015

Michelle K. Lee
*Deputy Director of the United States Patent and Trademark Office*